United States Patent
Lai et al.

(10) Patent No.: US 6,676,801 B2
(45) Date of Patent: Jan. 13, 2004

(54) PRESSURE SUPPRESSION DEVICE FOR CHEMICAL MECHANICAL POLISHING MACHINE AND METHOD THEREOF

(75) Inventors: Chien-Hsin Lai, Kaohsiung Hsien (TW); Jung-Nan Tseng, Hsinchu Hsien (TW); Huang-Yi Lin, Taichung Hsien (TW); Fu-Yang Yu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 436 days.

(21) Appl. No.: 09/845,371

(22) Filed: Apr. 30, 2001

(65) Prior Publication Data

US 2002/0153347 A1 Oct. 24, 2002

(30) Foreign Application Priority Data

Apr. 24, 2001 (TW) ........................................ 90109734 A

(51) Int. Cl.[7] ............................................. H01L 21/302
(52) U.S. Cl. .................... 156/345.12; 438/690; 438/706
(58) Field of Search .............. 134/1.2, 1.3; 156/345.12; 451/66; 438/706, 690, 710, 711

(56) References Cited

U.S. PATENT DOCUMENTS 6,057,245 A * 5/2000 Annapragada et al. ...... 438/706

FOREIGN PATENT DOCUMENTS

JP         2000058521        * 2/2000

* cited by examiner

Primary Examiner—Parriz Hassonzadeh
Assistant Examiner—Sylvia R. MacArthur
(74) Attorney, Agent, or Firm—J.C. Patents

(57) ABSTRACT

A pressure suppression device for a chemical mechanical polishing machine. The chemical mechanical polishing machine includes a polishing table and a polishing head. The polishing table has a polishing pad and a polishing gas input through which a polishing gas is charged. The polishing head holds a wafer and has a wafer gas input through which a wafer gas is charged. The pressure suppression device has a pressure releasing component and a gas input tube coupled to the wafer gas input and the pressure releasing component. When a polishing pressure applied to the polishing pad is smaller than a wafer pressure applied to the wafer, the pressure releasing component releases a part of the wafer pressure until the wafer pressure is smaller than the polishing pressure. As a result, this prevents the wafer slippage or broken wafer that occur when the wafer is blown off from the polishing head by too much wafer pressure.

16 Claims, 3 Drawing Sheets

PRESSURE SUPPRESSION DEVICE FOR CHEMICAL MECHANICAL POLISHING MACHINE AND METHOD THEREOF

CROSS-REFERENCE TO RELATED APPLICATION

This application claims the priority benefit of Taiwan application serial no. 90109734, filed on Apr. 24, 2001.

BACKGROUND OF THE INVENTION

1. Field of the Invention

The invention relates in general to a pressure suppression device for a chemical mechanical polishing machine and method thereof. More particularly, this invention relates to a pressure suppression device to suppress a pressure applied to a wafer until the pressure is smaller than a pressure applied to a polishing pad and the method thereof

2. Description of the Related Art

Chemical mechanical polishing (CMP) is a technique that provides a global planarization for very large semiconductor integration (VLSI) or ultra large semiconductor integration (ULSI). The technique makes use of a grinder-like mechanical polishing theory, so that an uneven surface profile of a wafer can be planarized when assisted with an appropriate reagent.

FIG. 1 shows a layout of a chemical mechanical polishing equipment. As shown in FIG. 1, the chemical mechanical polishing equipment comprises a polishing table 10 on which sits a wafer 14 and a polishing head 16 for holding the wafer 14 ready to be polished, wherein the polishing head holds a back face of the wafer 14, while a front to be polished, wherein the polishing head holds a back face of the wafer 14, while a front face of the wafer is pressed against is disposed on the polishing table 10 for performing the chemical mechanical polishing step.

While performing the chemical mechanical polishing process, the polishing table 10 and the polishing head 16 are rotating along a certain direction. A reagent (not shown) is continuously supplied onto the polishing table 10 to provide a chemical reaction for polishing. So, with the chemical reaction and the mechanical polishing applied to the wafer 14 on the polishing table 10, a portion of the deposited layer that protrudes from the wafer 14 is gradually removed.

When the wafer 14 is polished, a gas known as polishing gas is charged from a polishing gas input 11. The polishing gas generates a polishing pressure applied to the polishing pad 12. The polishing gas shown as Polish P/I 2 is output by the polishing table 10 to a transducer (not shown) in a pressure controller (not shown). Being converted into a current signal, the pressure is measured. A wafer gas input 15 of the polishing head 16 also charge with a wafer gas. The wafer gas generates a wafer pressure on the wafer 14 for performing the chemical mechanical polishing between the wafer 14 and the polishing pad 12.

FIG. 2 shows a block diagram for controlling chemical mechanical polishing pressure. In FIG. 2, the voltage signal of the polishing pressure setting point is sent to the polishing pressure regulator 20. When the polishing pressure regulator 20 receives the voltage signal, the polishing pressure regulator 20 convert the voltage signal into a corresponding pressure and output it from the polishing pressure output. The polishing pressure transducer 22 inspects the pressure output from the polishing pressure regulator 20. The inspected pressure is converted into a current signal and compared to that of the polishing pressure setting point, so that a stable polishing pressure can be output.

A voltage signal of a $\Delta P$ setting point is sent to a $\Delta P$ regulator 26. While receiving the voltage signal, the $\Delta P$ regulator 26 transforms it into a corresponding pressure to be output from a $\Delta P$ output. The $\Delta P$ transducer 24 inspects the output pressure from the $\Delta P$ regulator 26 and transforms the current signal output from the polishing pressure transducer 22. After comparing the current signal with that of the polishing pressure setting point, a stable $\Delta P$ pressure can be output.

While performing a chemical mechanical polishing planarization process, the polishing pressure by applying a force on the polishing pad has to be larger than the wafer pressure by applying a force on the wafer to provide a normal operation. That is, $\Delta P = W_p - P_p < 0$, wherein $W_p$ is the wafer pressure, $P_p$ is the polishing pressure, and $\Delta P$ is a difference between the wafer pressure and the polishing pressure.

In the above controlling method, once the outputs of the regulator and transducer are abnormal, the polishing pressure is smaller than the wafer pressure. So, the wafer is easily blown off from the polishing head to cause the wafer slippage or breakage.

SUMMARY OF THE INVENTION

The invention provides a pressure suppression device for a chemical mechanical polishing machine and a method thereof. The wafer pressure is controlled to be larger than the polishing pressure to avoid the wafer slippage and damage.

The invention provides a pressure suppression device of a chemical mechanical polishing machine. The chemical mechanical polishing machine comprises a polishing table and a polishing head. The polishing table further comprises a polishing pad and a polishing gas input to be charged with a polishing gas. The polishing gas generates a polishing pressure applied to the polishing pad. The polishing head is used to hold a wafer and comprises a wafer gas input to charge the wafer with a wafer gas. The wafer gas generates a wafer pressure applied to the wafer, so as to perform a chemical mechanical polishing between the wafer and the polishing pad. The pressure suppression device comprises a pressure releasing component which further comprises a spring. An gas input tube is coupled to the wafer gas input and the pressure releasing component, so that the wafer gas can be input to the pressure releasing component. When the polishing pressure applied to the polishing pad is smaller than the wafer pressure applied to the wafer, the spring in the pressure releasing component is deformed to release a part of the wafer pressure until the wafer pressure is smaller than the polishing pressure.

The invention further provides a pressure suppression method for a chemical mechanical polishing machine. The chemical mechanical polishing machine comprises a polishing table and a polishing head, wherein the polishing table has a polishing pad and the polishing head can hold a wafer. The pressure suppression method begins by charging the polishing table with a polishing gas, wherein the polishing gas generates a polishing pressure applied to the polishing pad. The polishing head is then charged the wafer with a wafer gas, wherein the wafer gas generates a wafer pressure applied to the wafer, so that a chemical mechanical polishing is performed between the wafer and the polishing pad. A pressure suppression device is installed, wherein the pressure releasing component further comprises a spring and an gas input tube coupled to the wafer gas input and the pressure releasing component, so that the wafer gas can be input to the pressure releasing component. When the polishing pressure applied to the polishing pad is smaller than the wafer pressure applied to the wafer, the spring in the pressure releasing component is deformed to release a part of the wafer pressure until the wafer pressure is smaller than the polishing pressure.

According to the present invention, a pressure suppression device for a chemical mechanical polishing machine and a method thereof are provided, where the pressure suppression device controls the polishing pressure to be larger than the wafer pressure when the wafer is polished. But, if the polishing pressure is smaller than the wafer pressure, the pressure releasing component will release an excessive part of the wafer pressure to prevent a huge wafer pressure. As a result, the slippage and breakage of wafers as occur in the conventional device and method can be avoided.

Both the foregoing general description and the following detailed description are exemplary and explanatory only and are not restrictive of the invention, as claimed.

DESCRIPTION OF THE PREFERRED EMBODIMENTS

Figure 1:
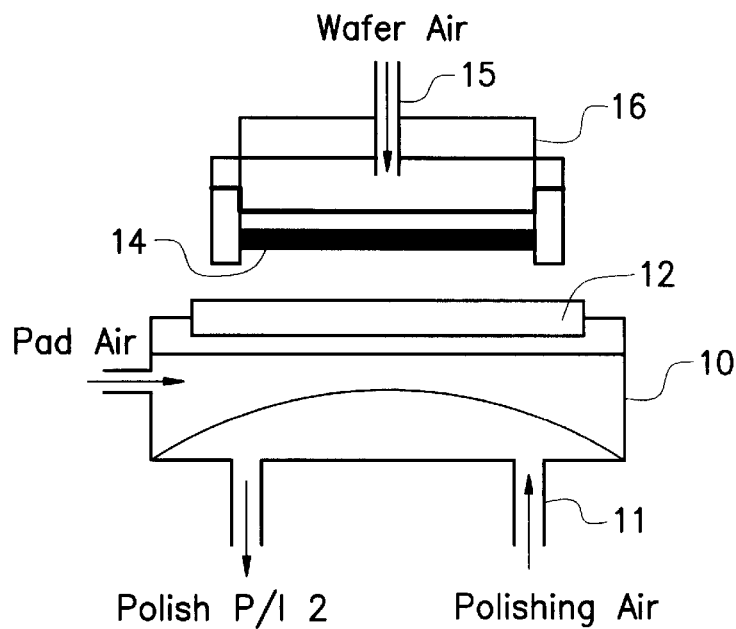
FIGS. 1 shows a layout of a chemical mechanical polishing machine.
Figure 2:
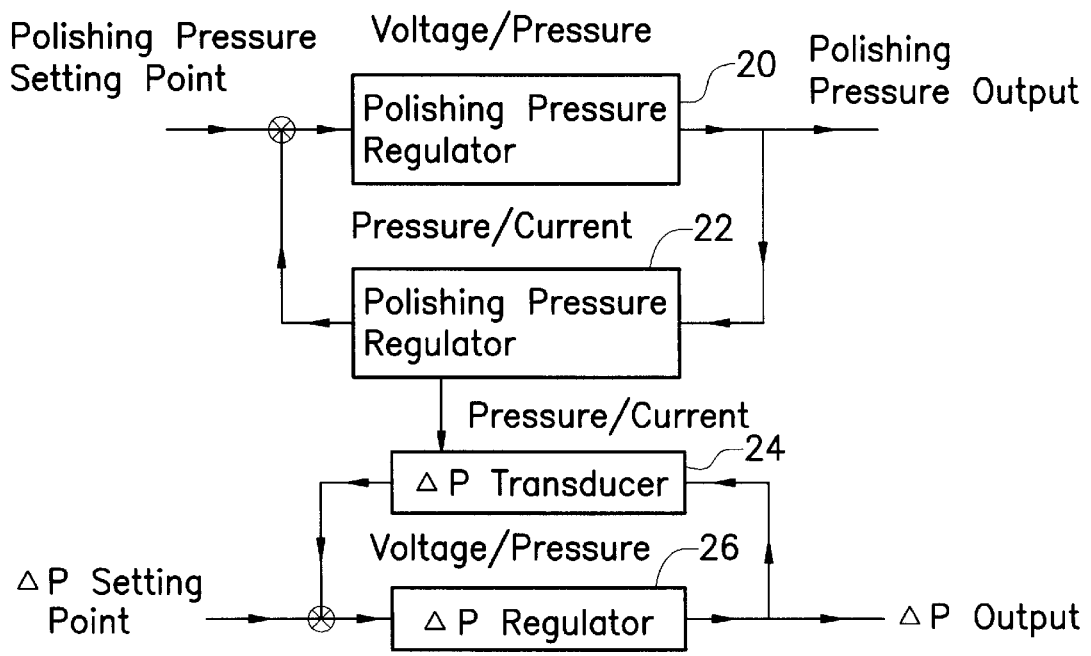
FIG. 2 is a block diagram for controlling the chemical mechanical polishing pressure.
Figure 3:
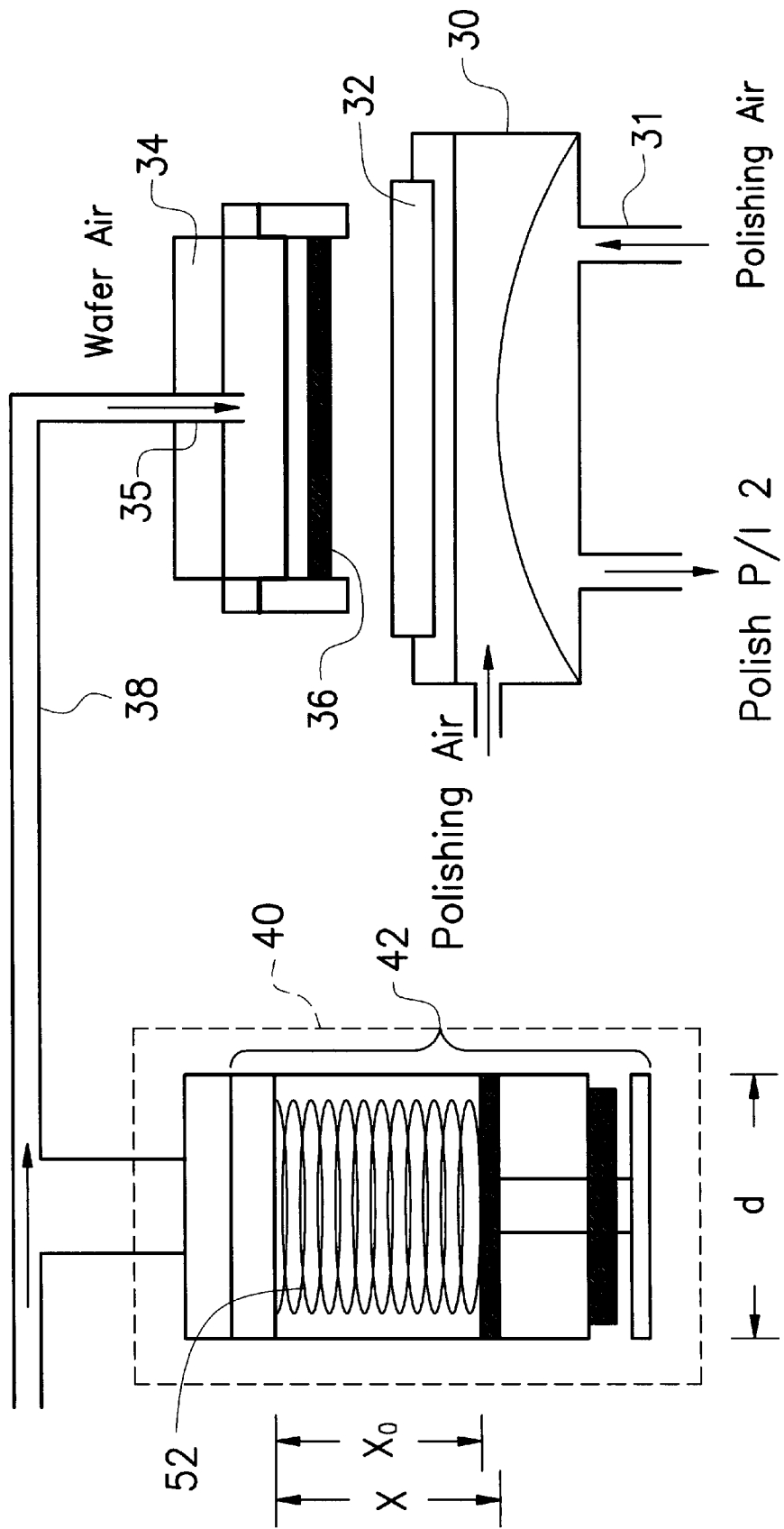
FIG. 3 shows a chemical mechanical polishing machine comprising a pressure suppression device according to the invention.

FIG. 3 shows a layout of a chemical mechanical polishing machine with a pressure suppression device. In FIG. 3, the chemical mechanical polishing machine comprises a polishing table 30 and a polishing head 34. The polishing table 30 has a polishing pad 32 thereon. The polishing pad 32 is charged with a polishing gas from a polishing gas input 31. Preferably, the gas pressure of the polishing gas is set at about 5 psi. As a result, a polishing pressure is applied to the polishing pad 32. The polishing gas shown as the Polish P/I 2 in FIG. 3 is further output to a transducer (not shown) in a pressure controller (not shown). The transducer then converts the pressure of the polishing gas into a current signal as a measurement for pressure.

The polishing head 34 is used to hold a wafer 36 ready to be polished. The polishing head 34 comprises a wafer gas input 35 through which the wafer 36 is charged with a wafer gas. As a result, a wafer pressure is applied to the wafer 36 for performing the chemical mechanical polishing between the wafer 36 and the polishing pad 32.

The pressure suppression device 40 comprises a pressure releasing component 42 and an gas input tube 38. The pressure releasing component 42 further comprises a spring 52. The force generated by the wafer gas input from the gas input tube 38 applied to the spring 52 can be expressed as $F = P_c \cdot A = \frac{1}{2} K \cdot S = \frac{1}{2} K \cdot (X - X_0)$. In the equation, $P_c$ is the wafer pressure applied to the wafer 36, A is the cross sectional area of the pressure suppression device 40, K is Young's module of the spring 52, S is displacement. In this embodiment, the elastic force of the spring 52 is set at 5 psi. According to the relationship between the wafer pressure and the polishing pressure, the Young's module K of the spring 52 can be obtained. When the wafer pressure is larger than the polishing pressure, that is, the pressure applied to the wafer 36 is larger than the pressure applied to the polishing pad 32, the spring 52 is deformed with a displacement. to release a part of the wafer pressure until the wafer pressure is smaller than the polishing pressure.

Figure 4:
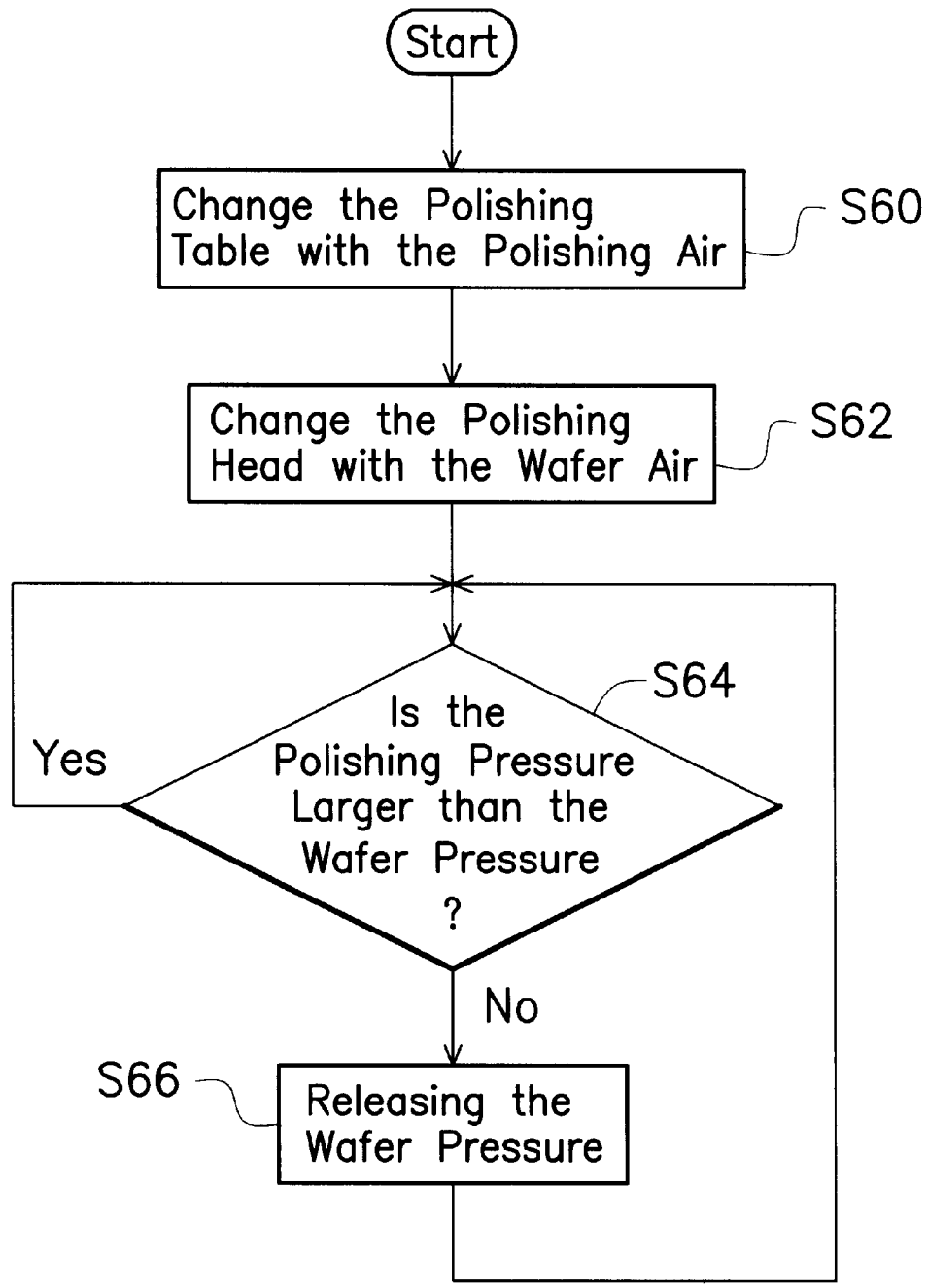
FIG. 4 is a block diagram for suppressing the pressure of a chemical mechanical machine.

FIG. 4 illustrates a flow chart of a pressure suppression method for a chemical mechanical polishing machine. Referring both to FIG. 3 and FIG. 4, a polishing are is charged through the polishing gas input 31 of the polishing table 30 into the polishing pad 32 gasin step S60, wherein the polishing gas generates a polishing pressure to be applied to the polishing pad. A wafer gas is charged though the wafer gas input 35 of the polishing head 34 gas in step S62, wherein the wafer gas generates a wafer pressure to be applied to the wafer 36, so that a chemical mechanical polishing is performed between the wafer 36 and the polishing pad 32. gasThe wafer gas is charged through the wafer gas tube to both the spring 52 of the pressure releasing component 42 and the wafer gas inlet 31 of the polishing head 34. So, when the polishing pressure applied to the polishing pad 32 is smaller than the wafer pressure applied on the wafer 36 (step S64), a part of the wafer pressure is released by the pressure releasing component 40 until the wafer pressure is smaller than the polishing pressure.

Summarizing from above, the present invention provides a pressure suppression device for a chemical mechanical polishing machine and a method thereof, wherein the pressure suppression device controls the polishing pressure to be larger than the wafer pressure when the wafer is polished. But, if the polishing pressure is smaller than the wafer pressure, the pressure releasing component will release an excessive part of the wafer pressure to prevent a huge wafer pressure. As a result, the slippage and breakage of wafers as occur in the conventional device and method can be avoided.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A pressure suppression device for a chemical mechanical polishing machine comprising a polishing table and a polishing head, wherein the polishing table further comprises a polishing pad and a polishing gas input through which a polishing gas is charged, the polishing gas generates a polishing pressure to apply to the polishing pad, and the polishing head for holding the wafer comprises a wafer gas input through which a wafer gas is charged, and the wafer gas generates a wafer pressure to apply to the wafer, the pressure suppression device comprising:

a pressure releasing component; and an gas inlet tube coupled to the wafer gas input and the pressure releasing component, so that the wafer gas is input into the pressure releasing component, a part of the wafer pressure is released when wafer pressure is larger than the polishing pressure until the wafer pressure is smaller than the polishing pressure.

2. The pressure suppression device according to claim 1, wherein the pressure releasing component further comprises a spring having a elastic force, wherein the spring is deformed to release a part of the wafer pressure when the wafer pressure is larger than the elastic force.

3. The pressure suppression device according to claim 2, wherein the polishing pressure is set at about 5 psi.

4. The pressure suppression device according to claim 2, wherein the elastic force is set at about 5 psi.

5. A pressure suppression device for a chemical mechanical polishing machine comprising a polishing table and a polishing head, wherein the polishing table further comprises a polishing pad and a polishing gas input through which a polishing gas is charged, the polishing gas generates a polishing pressure to apply to the polishing pad, and the polishing head for holding the wafer comprises a wafer gas input through which a wafer gas is charged, and the wafer gas generates a wafer pressure to apply to the wafer, the pressure suppression device comprising:

a pressure releasing component, wherein the pressure releasing component further comprises a spring having a elastic force; and an gas inlet tube coupled to the wafer gas input and the pressure releasing component, so that the wafer gas is input into the pressure releasing component, and a part of the wafer pressure is released when wafer pressure is larger than the polishing pressure until the wafer pressure is smaller than the polishing pressure.

6. The pressure suppression device according to claim 5, wherein the polishing pressure is set at about 5 psi.

7. The pressure suppression device according to claim 5, wherein a elastic force of the spring is set at about 5 psi.

8. A pressure suppression method for a chemical mechanical polishing machine, the chemical mechanical machine comprises a polishing table and a polishing head, the method comprising:

charging the polishing table with a polishing gas, so that the polishing gas generates a polishing pressure to apply to the polishing pad;

charging the polishing head with a wafer gas, so that the polishing gas generates a wafer pressure to apply to the wafer; and releasing a part of the wafer pressure when the wafer pressure is larger than the polishing pressure until the wafer pressure is smaller than the polishing pressure.

9. The pressure suppression method according to claim 8, wherein the step of releasing a portion of the wafer pressure comprises the steps of:

installing a pressure suppression device, wherein the pressure suppression device includes a pressure releasing component and an gas input tube coupled to the pressure releasing component and a wafer gas input, so that gasthe pressure releasing component is charged with the wafer gas; and releasing the wafer pressure when the wafer pressure is larger than the polishing pressure until the wafer pressure is smaller than the polishing pressure.

10. The pressure suppression method according to claim 9, wherein the pressure releasing component further includes a spring having a elastic force, wherein the spring is deformed to release a part of the wafer pressure when the wafer pressure is larger than the elastic force.

11. The pressure suppression method according to claim 10, wherein the polishing pressure is set at about 5 psi.

12. The pressure suppression method according to claim 10, wherein the elastic force of the spring is set at about 5 psi.

13. A pressure suppression method for a chemical mechanical machine comprising a polishing table with a polishing pad formed thereon and a polishing head for holding a wafer, the method comprising:

charging the polishing table with a polishing gas, so that the polishing gas generates a polishing pressure to apply to the polishing pad;

charging the polishing head with a wafer gas, so that the polishing gas generates a wafer pressure to apply to the wafer;

installing a pressure suppression device, wherein the pressure suppression device comprising a pressure releasing component and an gas inlet coupled to the pressure releasing component and a wafer gas input, so that the pressure releasing component is charged with the wafer gas; and releasing a part of the wafer pressure when the wafer pressure is larger than the polishing pressure until the wafer pressure is smaller than the polishing pressure.

14. The pressure suppression method according to claim 13, wherein the pressure releasing component further includes a spring having a elastic force, wherein the spring is deformed to release a part of the wafer pressure when the wafer pressure is larger than the elastic force.

15. The pressure suppression method according to claim 14, wherein gasthe polishing pressure is set at about 5 psi.

16. The pressure suppression method according to claim 14, wherein the elastic force of the spring is set at about 5 psi.

* * * * *